(12) United States Patent
Blythe

(10) Patent No.: US 9,953,257 B2
(45) Date of Patent: Apr. 24, 2018

(54) INTEGRATED CIRCUIT CARD

(71) Applicant: MasterCard International Incorporated, Purchase, NY (US)

(72) Inventor: Simon Blythe, Cambridgeshire (GB)

(73) Assignee: MASTERCARD INTERNATIONAL INCORPORATED, Purchase, NY (US)

( * ) Notice: Subject to any disclaimer, the term of this patent is extended or adjusted under 35 U.S.C. 154(b) by 0 days.

(21) Appl. No.: 15/347,063

(22) Filed: Nov. 9, 2016

(65) Prior Publication Data

US 2017/0132506 A1    May 11, 2017

(30) Foreign Application Priority Data

Nov. 11, 2015  (EP) ..................... 15194167

(51) Int. Cl.
G06K 19/077    (2006.01)
H01L 23/66     (2006.01)
H04B 5/00      (2006.01)
H04L 29/12     (2006.01)

(52) U.S. Cl.
CPC ....... *G06K 19/0772* (2013.01); *G06K 19/077* (2013.01); *G06K 19/0775* (2013.01); *G06K 19/07747* (2013.01); *H01L 23/66* (2013.01); *H04B 5/0031* (2013.01); *H04L 61/6054* (2013.01); *H01L 2223/6605* (2013.01); *H01L 2223/6677* (2013.01)

(58) Field of Classification Search
CPC .................................................. G06K 19/077
See application file for complete search history.

(56) References Cited

U.S. PATENT DOCUMENTS

| | | | |
|---|---|---|---|
| 4,697,073 A * | 9/1987 | Hara | G06K 19/07743 235/487 |
| 5,598,032 A | 1/1997 | Fidalgo | |
| 5,818,030 A | 10/1998 | Reyes | |
| 8,371,510 B2 * | 2/2013 | Schiller | G06K 19/077 235/375 |
| 9,368,427 B2 * | 6/2016 | Lin | H04B 1/3816 |
| 9,426,127 B2 * | 8/2016 | Huxham | H04L 63/0428 |
| 2002/0007554 A1 | 1/2002 | Takeda et al. | |
| 2003/0015803 A1 * | 1/2003 | Prietzsch | H01L 24/32 257/777 |

(Continued)

FOREIGN PATENT DOCUMENTS

| | | |
|---|---|---|
| DE | 19646184 A1 | 5/1998 |
| DE | 19735170 A1 | 9/1998 |

(Continued)

OTHER PUBLICATIONS

"European Search Report", European Patent Office, May 4, 2016 (May 4, 2016), for EP Patent Application No. 15194164.8-1806, 7 pgs.

*Primary Examiner* — Christle I Marshall
(74) *Attorney, Agent, or Firm* — Buckley, Maschoff & Talwalkar LLC

(57) ABSTRACT

An integrated circuit card (200) is described. The integrated circuit card comprises a card body (204, 306) and two components located in the card body (204), wherein a first component (214) of the two components includes an integrated circuit, and wherein the two components are in communication with a common electrical contact (208).

10 Claims, 10 Drawing Sheets

(56) References Cited

U.S. PATENT DOCUMENTS

| | | | |
|---|---|---|---|
| 2003/0151561 A1* | 8/2003 | Arisawa | G06K 19/07749 343/867 |
| 2006/0175417 A1* | 8/2006 | Ho | G06K 19/07 235/492 |
| 2009/0085178 A1 | 4/2009 | Ha et al. | |
| 2010/0252639 A1* | 10/2010 | Schiller | G06K 19/077 235/492 |
| 2011/0068438 A1 | 3/2011 | Yamazaki et al. | |
| 2013/0223018 A1* | 8/2013 | Xie | H01L 24/48 361/735 |
| 2013/0294602 A1* | 11/2013 | Huxham | H04L 63/0428 380/255 |
| 2014/0217614 A1* | 8/2014 | Lin | H04B 1/3816 257/777 |

FOREIGN PATENT DOCUMENTS

| | | | |
|---|---|---|---|
| EP | 0426406 | A2 | 5/1991 |
| EP | 2068274 | A1 | 6/2009 |
| WO | 01/52184 | A2 | 7/2001 |

* cited by examiner

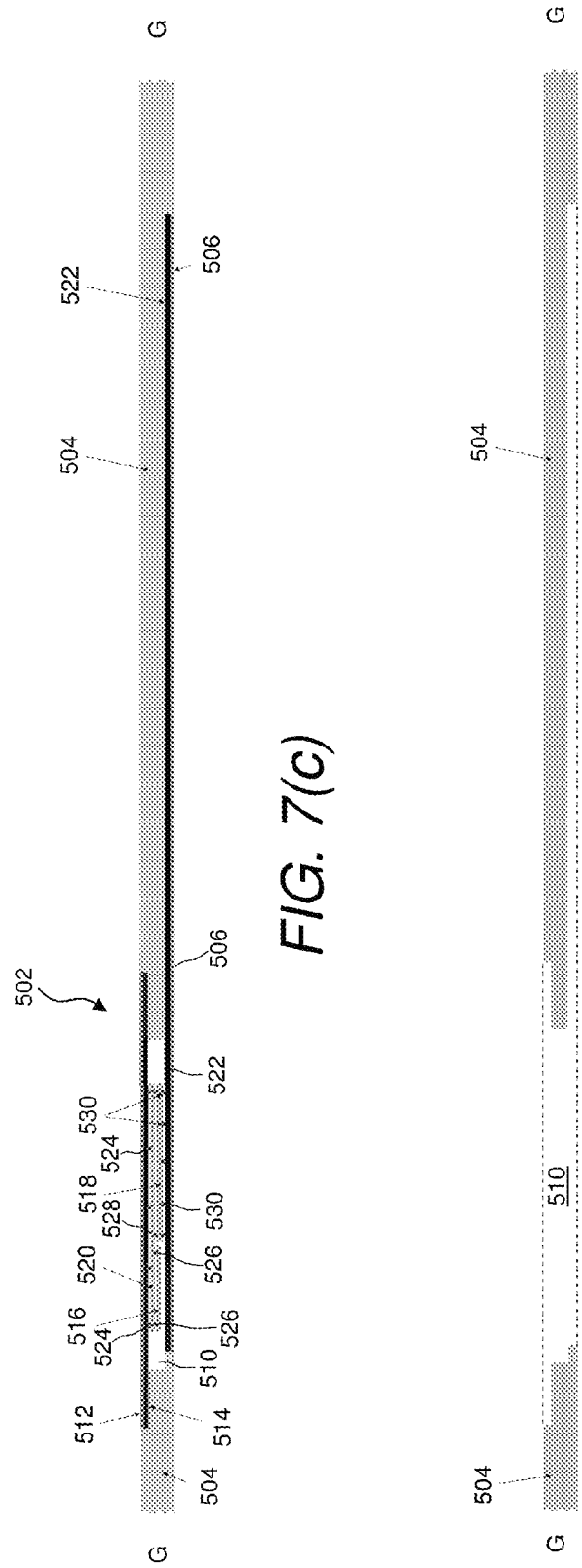

INTEGRATED CIRCUIT CARD

CROSS-REFERENCE TO RELATED APPLICATION

This application is a U.S. National Stage filing under 35 U.S.C. § 119, based on and claiming benefit of and priority to EP Patent Application No. 15194167.1 filed Nov. 11, 2015.

FIELD OF DISCLOSURE

The present disclosure relates to an integrated circuit card. In particular, but not exclusively, the present disclosure relates to an integrated circuit card comprising at least two integrated circuits, and methods of manufacturing an integrated circuit card comprising at least two integrated circuits.

BACKGROUND OF DISCLOSURE

Integrated Circuit Cards (ICC) are widely used as transaction devices (e.g. credit cards) for securely storing user data for payment transactions. ICC's are also widely used as subscriber identity module (SIM) cards for telecommunication devices. Typically, ICC's comprise an embedded integrated circuit in a body made of plastic. Many ICC's communicate data and obtain power through an electrical contact plate on the surface of the housing that connects to the integrated circuit.

FIG. 1(a) shows a front view of a typical ICC 100. The ICC 100 comprises an integrated circuit module 102 (i.e. a component) arranged in a body 104.

FIG. 1(b) shows a cross-sectional side view section along a line A-A of the ICC 100, in the region of the integrated circuit module 102. The body 104 comprises a recess 106 in which the integrated circuit module 102 is located. The integrated circuit module 102 comprises an electrical contact plate 108, a circuit board 110, an integrated circuit 112 and encapsulant 114.

FIG. 1(c) shows the shape of the recess 106 more clearly (illustrated without the integrated circuit module 102). The recess 106 comprises a peripheral portion 120 and a main portion 122. The peripheral portion 120 is shallower than the main portion 122. The peripheral portion 120 is arranged to contain the electrical contact plate 108 and the circuit board 110 such that the electrical contact plate 108 is substantially flush with the surface of the body 104. Accordingly, the depth of the peripheral portion 120 is substantially the same as the total combined thickness of the electrical contact plate 108 and the circuit board 110. The main portion 122 is arranged to contain the circuit board 110, the integrated circuit 112 and the encapsulant 114, underneath the electrical contact plate 108.

The electrical contact plate 108 is connected to a first side of the circuit board 110, and the integrated circuit 112 is connected to a second side of the circuit board 110. Generally, the integrated circuit 112 comprises a microcontroller. The integrated circuit 112 is electrically insulated by the encapsulant 114. For example, the encapsulant may comprise epoxy. Additionally, during manufacture (typically by lamination) of the ICC 100, the volume of encapsulant 114 may be controlled to ensure correct placement of the integrated circuit module 102.

Against this background, the present disclosure aims to provide an improved integrated circuit card comprising at least two integrated circuits.

SUMMARY OF DISCLOSURE

According to an aspect of the disclosure, there is provided an integrated circuit card comprising a card body and two components located in the card body, wherein a first component of the two components includes an integrated circuit, and wherein the two components are in communication with a common electrical contact.

Optionally, a second component of the two components includes one or more from a group comprising: an integrated circuit; a switch; a display; a sensor; a transducer; or a combination thereof. For example, the sensor may be fingerprint sensor or a pressure sensor, and the display may be an LCD or an e-paper display.

Optionally, the two components have a combined thickness that is substantially the same thickness as the card body.

The integrated circuit card may comprise an opening extending through the thickness of the card body, wherein the two components are located within the opening. Optionally, the card body comprises an upper surface and a lower surface, and the two components within the opening comprise an upper surface and a lower surface, wherein the upper and the lower surfaces of the two components are substantially flush with the upper and the lower surfaces of the card body. Optionally, wherein the card body comprises a rear side and a front side, wherein the opening is larger at the front side than the rear side.

The two components may be in communication with the electrical contact via an interface chip.

The integrated circuit card may comprise an International Mobile Subscriber Identity.

Optionally, the integrated circuit comprises a secure element.

The integrated circuit card may comprise a Near Field Communication antenna in communication with the integrated circuit. Optionally, the Near Field Communication antenna is arranged to connect to the antenna of a mobile device.

Optionally, the card body comprises alignment means for aligning the integrated circuit card relative to contact pins on a mobile device when the front side of the card is presented to the contact pins and wherein the alignment means is arranged to align the card relative to the contact pins when the back side of the card is presented to the contact pins. The alignment means may comprise two adjacent corners of the card.

BRIEF DESCRIPTION OF THE FIGURES

FIGS. 1(a), 1(b) and 1(c) have already been described above by way of background, in which:

FIG. 1(a) is a schematic front view of a prior art integrated circuit card;

FIG. 1(b) is a schematic cross-sectional side view along a line A-A of the integrated circuit card of FIG. 1(a); and FIG. 1(c) is a schematic cross-sectional side view along a line A-A of a recess in the integrated circuit card of FIG. 1(a).

Figure 2A:
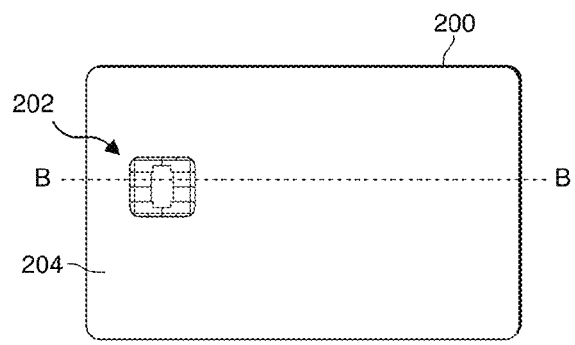
Figure 2B:
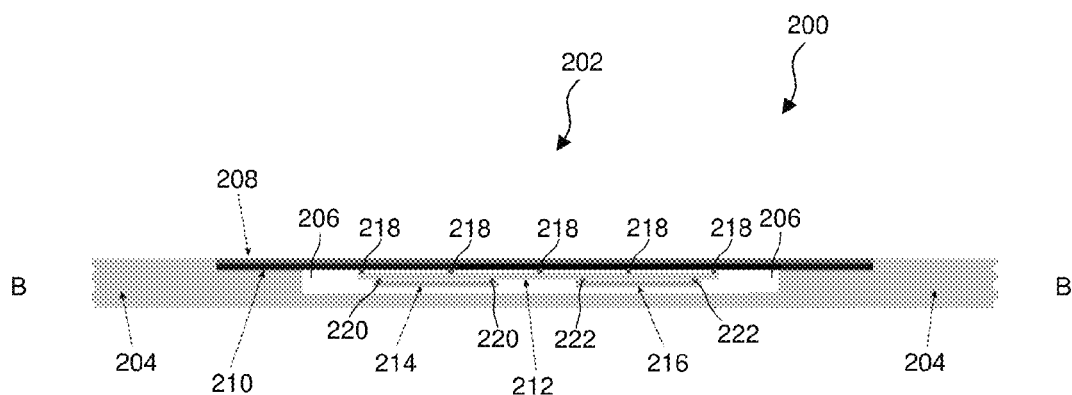
Figure 2C:
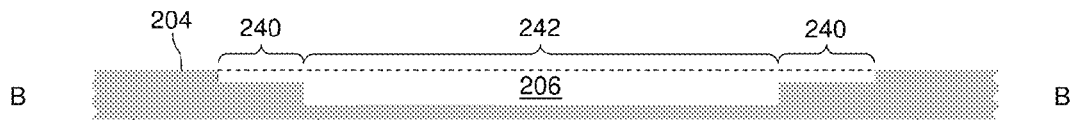
Figure 3A:
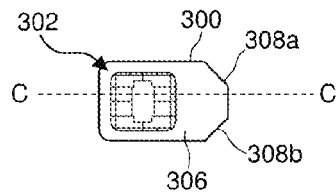
Figure 3B:
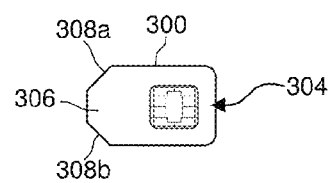
Figure 3C:
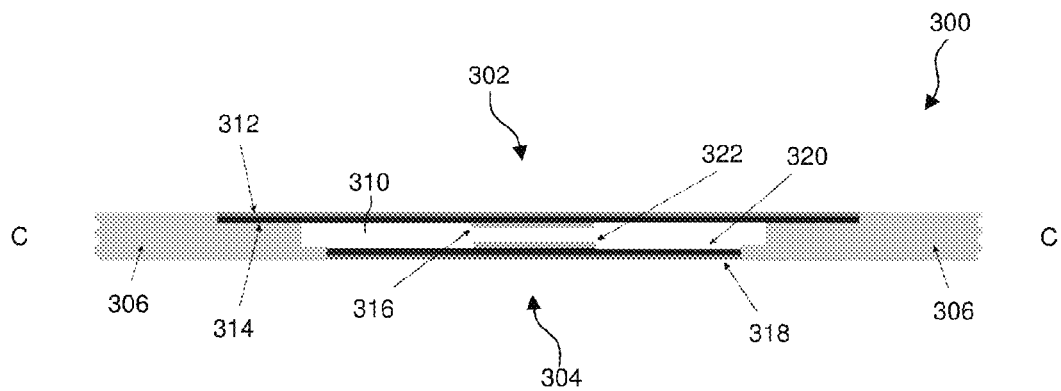
Figure 3D:
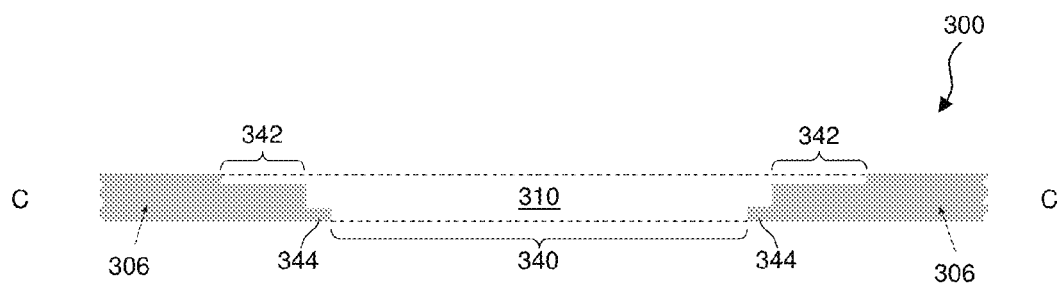
Figure 4A:
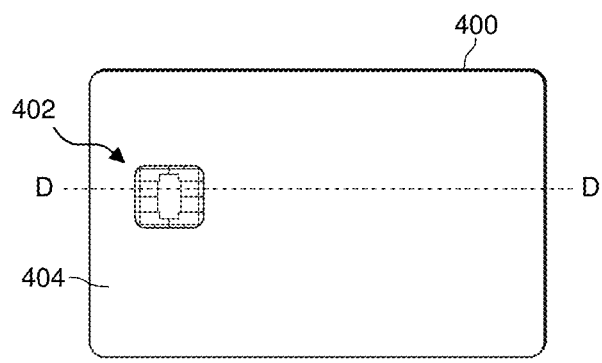
Figure 4B:
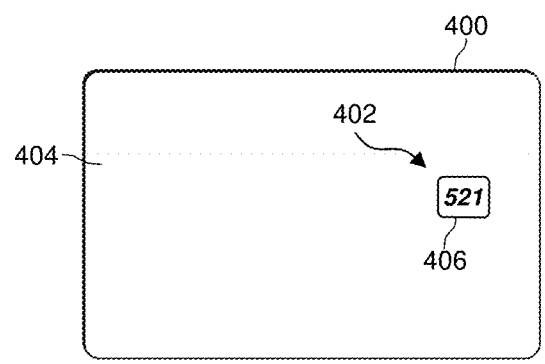
Figure 4C:
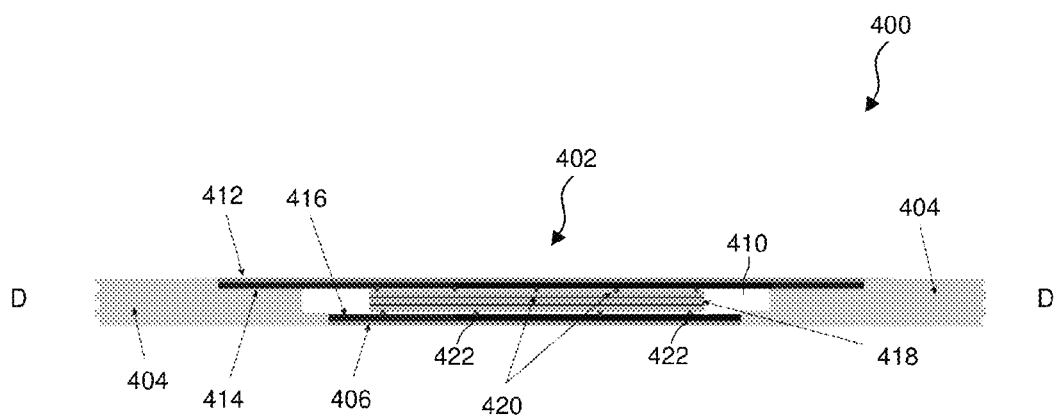
Figure 4D:
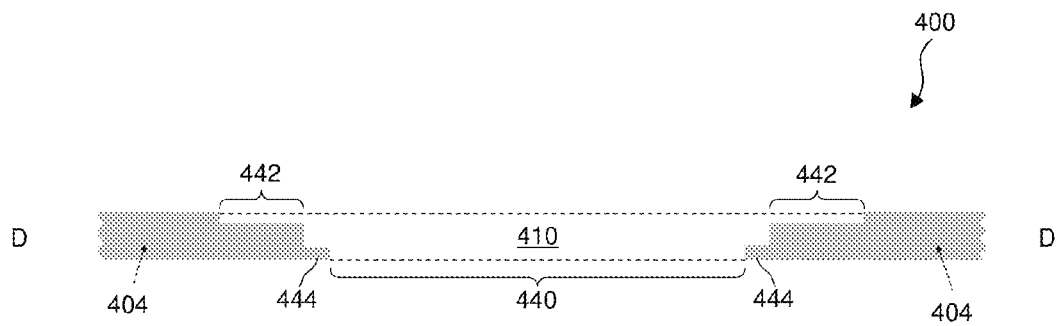
Figure 5A:
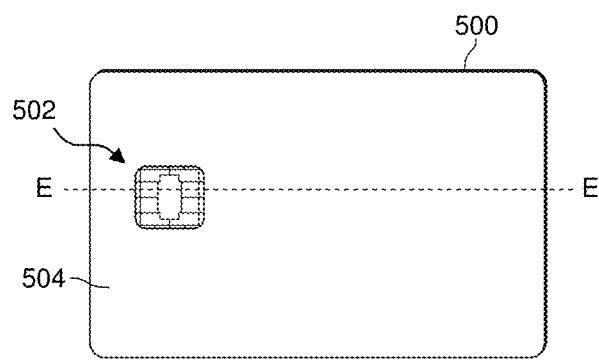
Figure 5B:
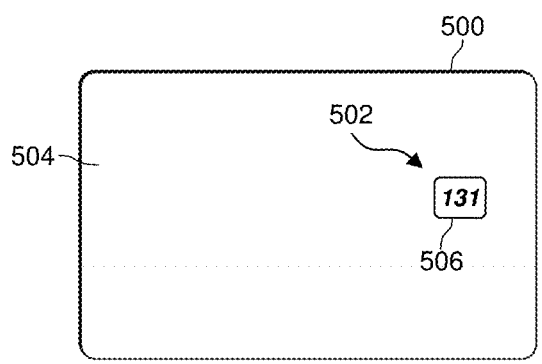
Figure 5C:
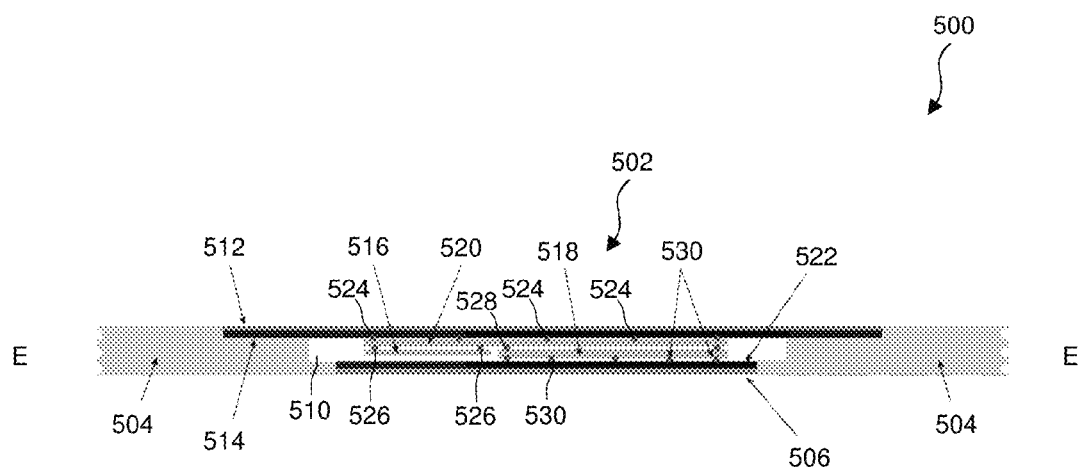
Figure 5D:
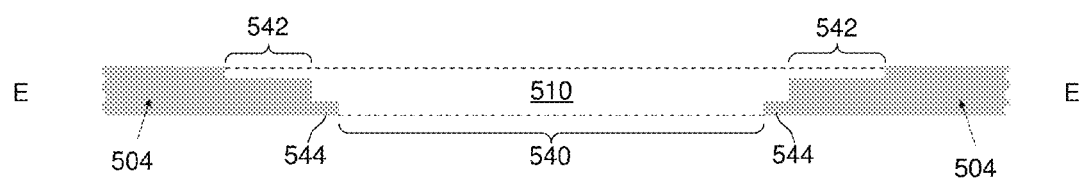
Figure 6A:
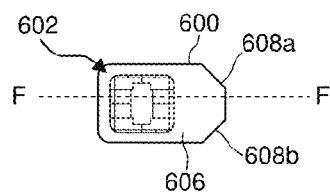
Figure 6B:
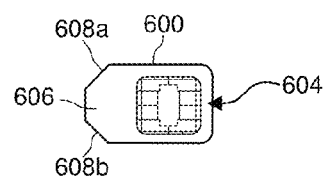
Figure 6C:
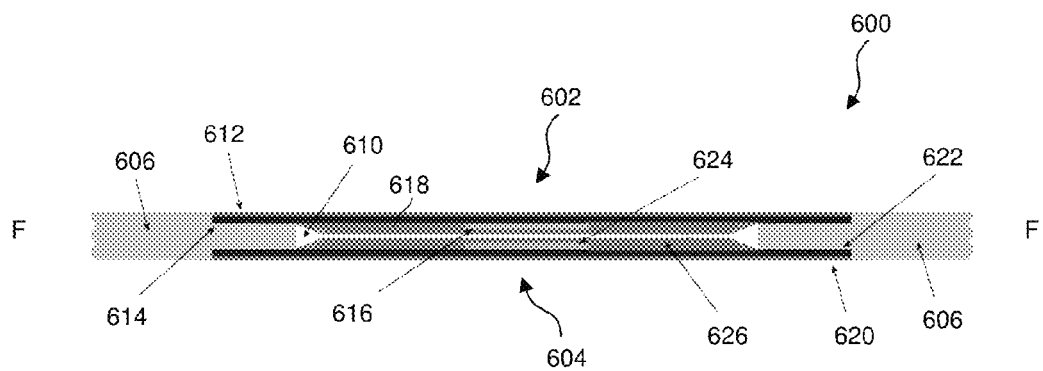
Figure 6D:
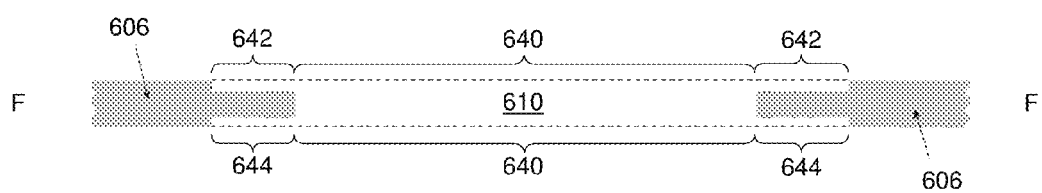
Figure 7A:
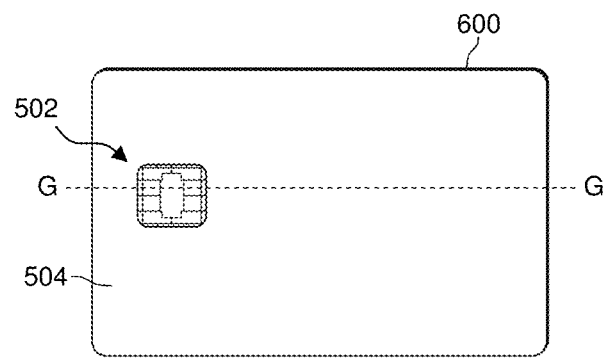
Figure 7B:
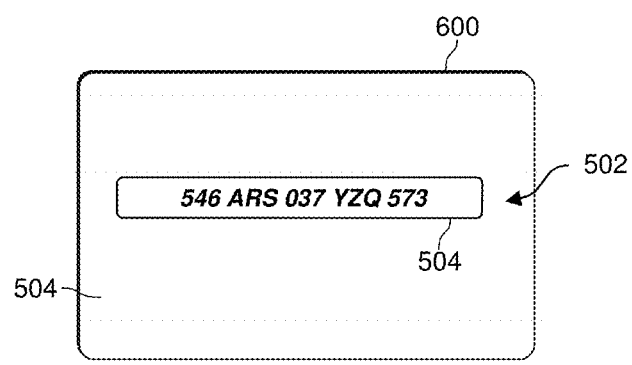

The disclosure will now be described in detail by way of example only, with reference to the remaining drawings, in which:

FIG. 2(a) is a schematic front view of an integrated circuit card comprising two integrated circuits sharing a common electrical contact according to an embodiment of the disclosure;

FIG. 2(b) is a schematic cross-sectional side view along a line B-B of the integrated circuit card of FIG. 2(a);

FIG. 2(c) is a schematic cross-sectional side view along a line B-B of a recess in the integrated circuit card of FIG. 2(a);

FIG. 3(a) is a schematic front view of an integrated circuit card comprising two integrated circuits according to an example useful for understanding the disclosure;

FIG. 3(b) is a schematic rear view of the integrated circuit card of FIG. 3(a);

FIG. 3(c) is a schematic cross-sectional side view along a line C-C of the integrated circuit card of FIG. 3(a);

FIG. 3(d) is a schematic cross-sectional side view along a line C-C of an opening in the integrated circuit card of FIG. 3(a);

FIG. 4(a) is a schematic front view of an integrated circuit card comprising a stacked die assembly according to an example useful for understanding the disclosure;

FIG. 4(b) is a schematic rear view of the integrated circuit card of FIG. 4(a),

FIG. 4(c) is a schematic cross-sectional side view along a line D-D of the integrated circuit card of FIG. 4(a);

FIG. 4(d) is a schematic cross-sectional side view along a line D-D of an opening in the integrated circuit card of FIG. 4(a);

FIG. 5(a) is a schematic front view of an integrated circuit card comprising a rear module according to an example useful for understanding the disclosure;

FIG. 5(b) is a schematic rear view of the integrated circuit card of FIG. 5(a);

FIG. 5(c) is a schematic cross-sectional side view along a line E-E of the integrated circuit card of FIG. 5(a);

FIG. 5(d) is a schematic cross-sectional side view along a line E-E of an opening in the integrated circuit card of FIG. 5(a);

FIG. 6(a) is a schematic front view of an integrated circuit card comprising two integrated circuits according to an example useful for understanding the disclosure;

FIG. 6(b) is a schematic rear view of the integrated circuit card of FIG. 6(a),

FIG. 6(c) is a schematic cross-sectional side view along a line F-F of the integrated circuit card of FIG. 6(a);

FIG. 6(d) is a schematic cross-sectional side view along a line F-F of an opening in the integrated circuit card of FIG. 6(a);

FIG. 7(a) is a schematic front view of an integrated circuit card comprising a rear module according to an example useful for understanding the disclosure;

FIG. 7(b) is a schematic rear view of the integrated circuit card of FIG. 7(a);

FIG. 7(c) is a schematic cross-sectional side view along a line G-G of the integrated circuit card of FIG. 7(a); and FIG. 7(d) is a schematic cross-sectional side view along a line G-G of an opening in the integrated circuit card of FIG. 7(a);

DETAILED DESCRIPTION OF SPECIFIC EMBODIMENTS

Specific embodiments are described below with reference to the figures.

FIG. 2(a) shows a front view of an ICC 200 according to an embodiment of the disclosure. The ICC 200 comprises an integrated circuit module 202 arranged in a body 204. The ICC 200 includes two distinct components (e.g. two distinct integrated circuits) that can be accessed using a common electrical contact plate.

FIG. 2(b) shows a cross-sectional side view section along a line B-B of the ICC 200, in the region of the integrated circuit module 202. The body 204 comprises a recess 206 in which the integrated circuit module 202 is located. The integrated circuit module 202 comprises an electrical contact plate 208, a circuit board 210, an interface chip 212, a first integrated circuit 214, a second integrated circuit 216, a first set of interconnects 218, a second set of interconnects 220 and a third set of interconnects 222. Each of the sets of interconnects comprises a plurality of interconnects.

Figure 1A:
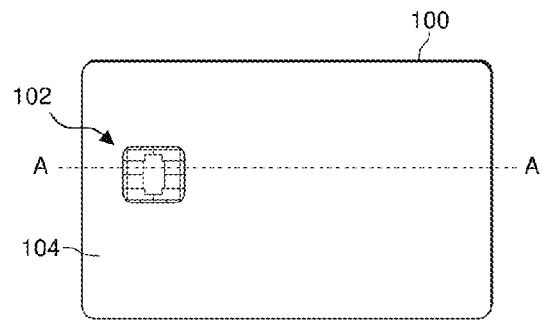
Figure 1B:
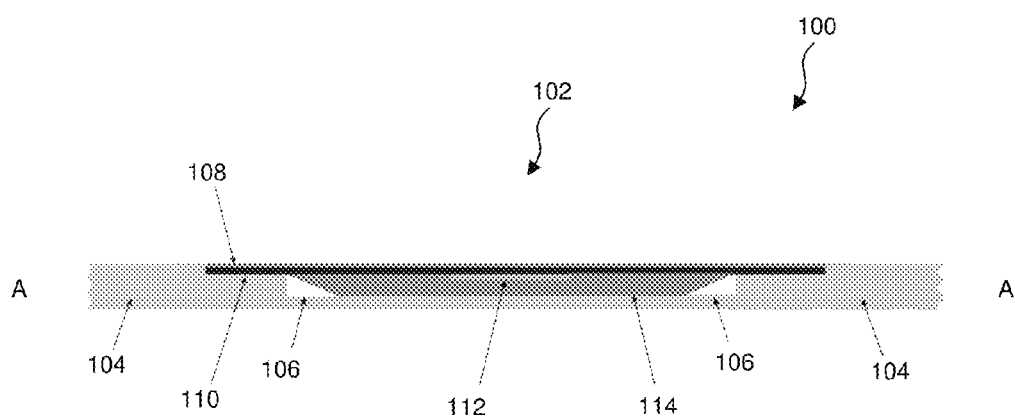
Figure 1C:
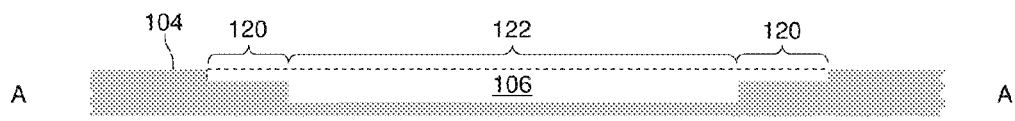

FIG. 2(c) shows the shape of the recess 206 more clearly (illustrated without the integrated circuit module 202). The recess 206 is substantially the same shape as the recess 106 of a typical prior art ICC 100 illustrated in FIG. 1(c). The recess 206 comprises a peripheral portion 240 and a main portion 242. The peripheral portion 240 is shallower than the main portion 242.

The peripheral portion 240 is arranged to contain the electrical contact plate 208 and the circuit board 210 such that the electrical contact plate 208 is substantially flush with the surface of the body 204. Accordingly, the depth of the peripheral portion 240 is substantially the same as the total combined thickness of the electrical contact plate 208 and the circuit board 210. The main portion 242 is arranged to contain the circuit board 210, the interface chip 212, the integrated circuits 214, 216, the sets of interconnects 218, 220, 222, all underneath the electrical contact plate 208.

In some embodiments, encapsulant may be used to fill any voids in the recess 206.

The electrical contact plate 208 is connected to a first side of the circuit board 210. A second side of the circuit board 210 is connected to a first side of the interface chip 212 via the first set of interconnects 218. A second side of the interface chip 212 is connected to the first integrated circuit 214 via the second set of interconnects 220. The second side of the interface chip 212 is also connected to the second integrated circuit 216 via the third set of interconnects 222.

The interface chip 212 is arranged to communicate data to and from both the first integrated circuit 214 and the second integrated circuit 216, either simultaneously or individually. The interface chip is further arranged to supply power to both the first and the second integrated circuit 214, 216.

For example, if the ICC 200 was for a transaction device, the first integrated circuit 214 and the second integrated circuit 216 may each comprise a secure element including transaction applications and cryptographic data that enable the ICC 200 to be used in secure payment transactions. When the ICC 200 is connected to a suitable point of interaction (e.g. a point of sale terminal), the selection between the secure elements of the first integrated circuit 214 and the second integrated circuit 216 may be made on the point of interaction.

Alternatively, if the ICC 200 was for a SIM card, the first integrated circuit 214 and the second integrated circuit 216 may each comprise a unique International Mobile Subscriber Identity (IMSI) for connecting to cellular telecommunications networks. When the ICC 200 is connected to a suitable user device (e.g. a mobile phone or tablet computer), the selection between the IMSI's of the first integrated circuit 214 and the second integrated circuit 216 may be made on the user device.

FIG. 3(a) shows a front view of an ICC 300 according to an example useful for understanding the disclosure. FIG. 3(b) shows a rear view of the ICC 300. The ICC 300 comprises a first integrated circuit module 302 and a second integrated circuit module 304 arranged in a body 306. The first integrated circuit module 302 is proximal to a front surface of the ICC 300, and the second integrated circuit module 304 is proximal to a rear surface of the ICC 300. In this example, the body 306 is substantially the shape of a standard mini-SIM card but with two notched corners 308a, 308b (instead of one in a standard mini-SIM card) for aligning and locating the ICC 300 relative to contact pins on a user device. The additional notched corner (compared to the standard mini-SIM) enables the ICC 300 to be reversible.

FIG. 3(c) shows a cross-sectional side view section along a line C-C of the ICC 300, in the region of the integrated circuit modules 302, 304. The body 306 comprises an opening 310 through the thickness of the body 306. The first and the second integrated circuit modules 302, 304 are located in the opening 310. The first integrated circuit module 302 comprises a front electrical contact plate 312, a front circuit board 314 and a front integrated circuit 316. The second integrated circuit module 304 comprises a rear electrical contact plate 318, a rear circuit board 320 and a rear integrated circuit 322. The rear electrical contact plate 318 is smaller than the front electrical contact plate 312.

FIG. 3(d) shows the shape of the opening 310 more clearly (illustrated without the integrated circuit modules 302, 304). The opening 310 comprises a through portion 340, a front peripheral portion 342 and a rear lip 344. The through portion 340 comprises a hole that extends through the thickness of the body 306.

The front peripheral portion 342 is shallower than the thickness of the body 306. The front peripheral portion 342 is arranged to contain the front electrical contact plate 312 and the front circuit board 314 such that the front electrical contact plate 312 is substantially flush with the surface of the body 306. Accordingly, the depth of the front peripheral portion 342 is substantially the same as the total combined thickness of the front electrical contact plate 312 and the front circuit board 314. The rear lip 344 reduces the size of the through portion 340.

The front electrical contact plate 312 is connected to a first side of the front circuit board 314, and the front integrated circuit 316 is connected to a second side of the front circuit board 314. The rear electrical contact plate 318 is connected to a first side of the rear circuit board 320, and the rear integrated circuit 322 is connected to a second side of the rear circuit board 320. The first integrated circuit module 302 and the second integrated circuit module 304 are electrically isolated from each other.

The opening 310 is arranged such that, during manufacture, the first integrated circuit module 302 and the second integrated circuit module 304 can be inserted into the body 306 together in one action.

In other examples, the opening 310 does not comprise a rear lip 344. In some examples, encapsulant may be used to fill any voids in the recess 310.

FIG. 4(a) shows a front view of an ICC 400 according to an example useful for understanding the disclosure. FIG. 4(b) shows a rear view of the ICC 400. The ICC 400 comprises an integrated circuit module 402 arranged in a body 404. The integrated circuit module 402 extends from a front surface of the ICC 400 to a rear surface of the ICC. The integrated circuit module 402 comprises a display 406 (i.e. a component) on the rear surface of the ICC 400.

FIG. 4(c) shows a cross-sectional side view section along a line D-D of the ICC 400, in the region of the integrated circuit module 402. The body 404 comprises an opening 410 through the thickness of the body 404. In addition to the display 406, the integrated circuit module 402 comprises a front electrical contact plate 412, a front circuit board 414, a rear circuit board 416, a stacked die assembly 418, a first set of interconnects 420 and a second set of interconnects 422. Each of the sets of interconnects comprises a plurality of interconnects.

FIG. 4(d) shows the shape of the recess 410 more clearly (illustrated without the integrated circuit module 402). The opening 410 comprises a through portion 440, a front peripheral portion 442 and a rear lip 444. The through portion 440 comprises a hole that extends through the thickness of the body 404.

The front peripheral portion 442 is shallower than the thickness of the body 404. The front peripheral portion 442 is arranged to contain the front electrical contact plate 412 and the front circuit board 414 such that the front electrical contact plate 412 is substantially flush with the surface of the body 404. Accordingly, the depth of the front peripheral portion 442 is substantially the same as the total combined thickness of the front electrical contact plate 412 and the front circuit board 414. The rear lip 444 reduces the size of the through portion 440.

The front electrical contact plate 412 is connected to a first side of the front circuit board 414. A second side of the front circuit board 414 is connected to a first side of the stacked die assembly 418 via the first set of interconnects 420. The display 406 is connected to a first side of the rear circuit board 416. A second side of the rear circuit board 416 is connected to a second side of the stacked die assembly 418 via the second set of interconnects 422.

The opening 410 is arranged such that, during manufacture, the integrated circuit module 402 can be inserted into the body 404 together in one action.

The stacked die assembly 418 comprises an integrated circuit and a display driver integrated circuit. The display 406 may be an electronic paper display, for example capable of retaining static text and images indefinitely without power. In FIG. 4(b), the display 406 is illustrated as displaying the text '521'.

For example, if the ICC 400 was a transaction device, the display 406 could be used to provide a temporary Card Verification Value (CVV) number that is determined by the integrated circuit of the stacked die assembly 418 and updated on the display 406 when the payment device is connected to a point of interaction. A temporary CVV number would provide additional security for card-not-present transactions compared to a printed CVV. Alternatively, the display 406 could be used to display a machine readable code (e.g. Quick Response code, barcode etc.). The code would be determined by the integrated circuit of the stacked die assembly 418 and updated on the display 406 when the payment device is connected to a point of interaction. The code could then be scanned by a camera in a phone, tablet or laptop for use in online card-not-present transactions.

FIG. 5(a) shows a front view of an ICC 500 according to an example useful for understanding the disclosure. FIG. 5(b) shows a rear view of the ICC 500. The ICC 500 comprises an integrated circuit module 502 arranged in a body 504. The integrated circuit module 502 extends from a front surface of the ICC 500 to a rear surface of the ICC. The integrated circuit module 502 comprises a display 506 on the rear surface of the ICC 500.

FIG. 5(c) shows a cross-sectional side view section along a line E-E of the ICC 500, in the region of the integrated circuit module 502. The body 504 comprises an opening 510 through the thickness of the body 504. In addition to the display 506, the integrated circuit module 502 comprises a front electrical contact plate 512, a front circuit board 514, an integrated circuit 516, a display driver integrated circuit 518, an interface chip 520, a rear circuit board 522, a first set of interconnects 524, a second set of interconnects 526, a third set of interconnects 528 and a fourth set of interconnects 530. Each of the sets of interconnects comprises a plurality of interconnects.

FIG. 5(d) shows the shape of the recess 510 more clearly (illustrated without the integrated circuit module 502). The opening 510 comprises a through portion 540, a front peripheral portion 542 and a rear lip 544. The through portion 540 comprises a hole that extends through the thickness of the body 504.

The front peripheral portion 542 is shallower than the thickness of the body 504. The front peripheral portion 542 is arranged to contain the front electrical contact plate 512 and the front circuit board 514 such that the front electrical contact plate 512 is substantially flush with the surface of the body 504. Accordingly, the depth of the front peripheral portion 542 is substantially the same as the total combined thickness of the front electrical contact plate 512 and the front circuit board 514. The rear lip 544 reduces the size of the through portion 540.

The front electrical contact plate 512 is connected to a first side of the front circuit board 514. A second side of the front circuit board 514 is connected to a first side of the interface chip 520 via the first set of interconnects 524. The interface chip 520 is connected on a second side to the integrated circuit 516 via the second set of interconnects 526. The second side of the interface chip 520 is also connected to a first side of the display driver integrated circuit 518 via the third set of interconnects 528. A second side of the display driver integrated circuit 518 is connected to a first side of the rear circuit board 522 via the fourth set of interconnects 530. A second side of the rear circuit board 522 is connected to the display 506.

The opening 510 is arranged such that, during manufacture, the integrated circuit module 502 can be inserted into the body 504 together in one action.

The display 506 can be used in substantially the same way as the display 406 of the ICC 400 examples described with reference to FIGS. 4(a) to (d).

FIG. 6(a) shows a front view of an ICC 600 according to an example useful for understanding the disclosure. FIG. 6(b) shows a rear view of the ICC 600. The ICC 600 comprises a first integrated circuit module 602 and a second integrated circuit module 604 arranged in a body 606. The first integrated circuit module 602 is proximal to a front surface of the ICC 600, and the second integrated circuit module 604 is proximal to a rear surface of the ICC 600. In this example, the body 606 is substantially the shape of a standard mini-SIM card but with two notched corners 608a, 608b (instead of one in a standard mini-SIM card) for aligning and locating the ICC 600 relative to contact pins on a user device. The additional notched corner (compared to the standard mini-SIM) enables the ICC 600 to be reversible.

FIG. 6(c) shows a cross-sectional side view section along a line F-F of the ICC 600, in the region of the integrated circuit modules 602, 604. The body 606 comprises an opening 610 through the thickness of the body 606. The first and the second integrated circuit modules 602, 604 are located in the opening 610.

The first integrated circuit module 602 comprises a front electrical contact plate 612, a front circuit board 614, a front integrated circuit 616 and front encapsulant 618. The second integrated circuit module 604 comprises a rear electrical contact plate 620, a rear circuit board 622, a rear integrated circuit 624 and rear encapsulant 626. The first integrated circuit module 602 is substantially the same size as the second integrated circuit module 604.

FIG. 6(d) shows the shape of the recess 610 more clearly (illustrated without the integrated circuit modules 602, 604). The opening 610 comprises a through portion 640, a front peripheral portion 642 and a rear peripheral portion 644.

The front peripheral portion 642 is shallower than the thickness of the body 606. The front peripheral portion 642 is arranged to contain the front electrical contact plate 612 and the front circuit board 614 such that the front electrical contact plate 612 is substantially flush with the front surface of the body 606. Accordingly, the depth of the front peripheral portion 642 is substantially the same as the total combined thickness of the front electrical contact plate 612 and the front circuit board 614.

Similarly, the rear peripheral portion 644 is shallower than the thickness of the body 606. The rear peripheral portion 644 is arranged to contain the front electrical contact plate 620 and the rear circuit board 622 such that the rear electrical contact plate 620 is substantially flush with the rear surface of the body 606. Accordingly, the depth of the rear peripheral portion 644 is substantially the same as the total combined thickness of the rear electrical contact plate 620 and the rear circuit board 622.

The front electrical contact plate 612 is connected to a first side of the front circuit board 614, and the front integrated circuit 616 is connected to a second side of the front circuit board 614. The front integrated circuit 616 is electrically insulated by the front encapsulant 618.

The rear electrical contact plate 620 is connected to a first side of the rear circuit board 622, and the rear integrated circuit 624 is connected to a second side of the rear circuit board 622. The rear integrated circuit 624 is electrically insulated by the rear encapsulant 626. The first integrated circuit module 602 is electrically isolated from the second integrated circuit module 604.

The front integrated circuit 616 and the rear front integrated circuit 624 each comprise a unique IMSI for connecting to cellular telecommunications networks.

As the person skilled in the art will appreciate, modifications and variations to the above embodiments may be provided, and further embodiments may be developed, without departing from the spirit and scope of the disclosure.

For example, FIGS. 7(a) to (d) show an ICC 600 which is an alternative example useful for understanding the ICC 500 described with reference to FIGS. 5(a) to (d). The ICC 600 is substantially the same as the ICC 500 but the display 504 extending along the rear of the ICC 600. The integrated circuit module 502 may be inserted from one side of the ICC 600 (e.g. the rear side) then twisted relative to the hole through the card. The integrated circuit module 502 can then be bonded from both sides in a single step. Alternatively, the front side and rear side modules may be inserted in a two-step process and either electrically connected to each other (if required) during the bonding process, or coupled wirelessly/optically for the transmission of power/data between the front and rear modules.

The integrated circuit module of the ICC 400, 500 may comprise a different type of component, for example, a sensor in place of the display (406 in the example of FIG. 4 or 506 in the example of FIG. 5), and an integrated circuit for controlling the sensor in place of the display driver integrated circuit. For example, the sensor may be a finger print sensor for authorizing the use of the ICC 400, 500 in payment transactions if the ICC 400 was a transaction device. Other suitable sensors to take the place of the display may include a pressure transducer, a microphone or an electromagnetic acoustic transducer.

Alternatively, the display may be replaced by an optical or and electrical interconnect for communicating data between the ICC and an external device.

Embodiments of the Integrated Circuit Cards (ICCs) have been illustrated as ISO/IEC 7810:2003 ID-1 sized cards (i.e. standard credit card size) or as modified mini-SIM cards. However, the ICC may have any shape and size, for example micro-SIM, nano-SIM or any arbitrary shape and size.

In the examples and embodiments described above which comprise at least two integrated circuits (e.g. ICCs 200, 300, 400, 500, 600), the rear integrated circuit may comprise a SIM and the front module may comprise a secure element (e.g. to be used in EMV transactions) or vice versa. The two integrated circuits may share a single package and/or electrical interface.

Further, an ICC may be arranged for use with 'contactless' Near Field Communication (NFC) systems. In this example, an ICC may be provided with two integrated circuits, one of which may comprise a secure element comprising a 2-wire NFC device. Upon insertion into a mobile device the NFC device may be arranged to be operatively connect to a mobile device antenna via unused contacts on the electrical contact plate of the ICC.

In the description above reference is made to electrical contact plates 208, 312, 318, 412, 512, 612 and 620. Although these electrical contacts have been described as being in the form of an "electrical contact plate", it should be appreciated that the electrical contacts (208, 312, 318, 412, 512, 612 and 620) may take any convenient configuration/form.

The invention claimed is:

1. An integrated circuit card comprising:
a card body having an opening through a thickness of the card body, the opening comprising a peripheral portion shallower than the thickness of the card body; and
two components located in the opening of the card body, wherein at least one of the two components includes an integrated circuit, each of the two components having an electrical contact plate,
wherein the opening of the card body is configured to receive the first component therein such that the electrical contact plate of the first component is disposed at least in the peripheral portion and is substantially flush with a first surface of the card body, and
the opening of the card body is configured to receive the second component therein such that the electrical contact plate of the second component is substantially flush with a second surface of the card body.

2. The integrated circuit card of claim 1, wherein the second component of the two components includes one or more from a group comprising: an integrated circuit; a switch; a display; a sensor; a transducer; or a combination thereof.

3. The integrated circuit card of claim 1, wherein the two components have a combined thickness that is substantially the same thickness as the card body.

4. The integrated circuit card of claim 1, wherein the integrated circuit comprises an International Mobile Subscriber Identity.

5. The integrated circuit card of claim 1, wherein the integrated circuit comprises a secure element.

6. The integrated circuit card of claim 1, further comprising a Near Field Communication antenna in communication with the integrated circuit.

7. The integrated circuit card of claim 6, wherein the Near Field Communication antenna is arranged to connect to the antenna of a mobile device.

8. The integrated circuit card of claim 1, wherein the card body comprises alignment means for aligning the integrated circuit card relative to contact pins on a mobile device when a front side of the card is presented to the contact pins and wherein the alignment means is arranged to align the card relative to the contact pins when a back side of the card is presented to the contact pins.

9. The integrated circuit card of claim 1, wherein the electrical contact plate of the second component has a smaller area, in a plane of the card body, than the electrical contact plate of the first component.

10. The integrated circuit card of claim 1, wherein the opening of the card body comprises the peripheral portion, a through portion, and a lip portion at the second surface of the card body, the lip portion reducing an area of the through portion, in a plane of the card body.

* * * * *